US006858359B2

(12) United States Patent
Kitson et al.

(10) Patent No.: US 6,858,359 B2
(45) Date of Patent: Feb. 22, 2005

(54) THERMALLY SENSITIVE, MULTILAYER IMAGEABLE ELEMENT

(75) Inventors: Anthony P. Kitson, Evans, CO (US); Kevin B. Ray, Fort Collins, CO (US); Eugene L. Sheriff, Carr, CO (US)

(73) Assignee: Kodak Polychrome Graphics, LLP, Norwalk, CT (US)

( * ) Notice: Subject to any disclaimer, the term of this patent is extended or adjusted under 35 U.S.C. 154(b) by 95 days.

(21) Appl. No.: 10/264,814

(22) Filed: Oct. 4, 2002

(65) Prior Publication Data

US 2004/0067432 A1 Apr. 8, 2004

(51) Int. Cl.[7] ............................ G03F 7/004; G03F 7/30

(52) U.S. Cl. ............................ 430/14; 430/18; 430/166; 430/190; 430/270.1; 430/302

(58) Field of Search ............................ 430/14, 18, 166, 430/190, 270.1, 302

(56) References Cited

U.S. PATENT DOCUMENTS

| | | | | |
|---|---|---|---|---|
| 6,294,311 B1 * | 9/2001 | Shimazu et al. | ......... | 430/271.1 |
| 6,352,811 B1 | 3/2002 | Patel et al. | .............. | 430/270.1 |
| 6,352,812 B1 | 3/2002 | Shimazu et al. | ......... | 430/273.1 |
| 6,358,669 B1 | 3/2002 | Savariar-Hauck et al. | ....................... | 430/273.1 |

FOREIGN PATENT DOCUMENTS

| | | |
|---|---|---|
| EP | 0908307 | 4/1999 |
| EP | 0908784 | 4/1999 |
| EP | 0960728 | 12/1999 |
| EP | 1023994 | 8/2000 |
| EP | 0864420 | 5/2001 |
| EP | 0908305 | 11/2001 |
| EP | 0950518 | 1/2002 |
| EP | 0940266 | 6/2002 |
| JP | 2001-042509 | 2/2001 |
| JP | 2001-042510 | 2/2001 |
| WO | WO 01/96119 A1 | 12/2001 |
| WO | WO 02/33491 A2 | 4/2002 |

* cited by examiner

*Primary Examiner*—John S. Chu
(74) *Attorney, Agent, or Firm*—RatnerPrestia

(57) ABSTRACT

Multi-layer, positive working, thermally sensitive imageable elements, useful as lithographic printing plate precursors, are disclosed. The elements comprises a substrate, an underlayer over the substrate, and a top layer over the underlayer. The top layer comprises polymeric material, which is a solvent soluble novolac resin or a derivative thereof. The polymeric material is a (a) novolac that has a weight average molecular weight of at least 10,000, a derivative thereof functionalized with polar groups, or a derivative thereof functionalized with quadruple hydrogen bonding entities; (b) a solvent soluble m-cresol/p-cresol novolac resins that comprises at least 10 mol % p-cresol and has a weight average molecular weight of at least 8,000, a derivative thereof functionalized with polar groups, or a derivative thereof functionalized with quadruple hydrogen bonding entities; or (c) a mixture thereof. The imageable elements have increased scuff resistance and are thus less susceptible to damage during handling.

37 Claims, No Drawings

THERMALLY SENSITIVE, MULTILAYER IMAGEABLE ELEMENT

FIELD OF THE INVENTION

This invention relates to lithographic printing. More particularly, this invention relates to positive working, multi-layer thermally imageable elements in which the top layer comprises a novolac resin.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise a top layer applied over the surface of a hydrophilic substrate. The top layer includes one or more radiation-sensitive components, which may be dispersed in a suitable binder. Alternatively, the radiation-sensitive component can also be the binder material.

If after exposure to radiation, the exposed regions are removed in the developing process, revealing the underlying hydrophilic surface of the substrate, the plate is called a positive-working printing plate. Conversely, if the unexposed regions are removed by the developing process and the exposed regions remain, the plate is called a negative-working plate. In each instance, the regions of the radiation-sensitive layer (i.e., the image areas) that remain repel water and accept ink, and the regions of the hydrophilic surface revealed by the developing process accept water, typically a fountain solution.

Direct digital imaging of offset printing plates, which obviates the need for exposure through a negative, is becoming increasingly important in the printing industry. Positive working, multi-layer, thermally imageable elements that comprise a hydrophilic substrate, an alkali developer soluble underlayer, and a thermally imageable top layer have been disclosed. On thermal imaging, the exposed regions of the top layer become soluble in or permeable by the alkaline developer. The developer penetrates the top layer and removes the underlayer and the top layer, revealing the underlying substrate. Such systems are disclosed in, for example, Parsons, U.S. Pat. No. 6,280,899; Shimazu, U.S. Pat. No. 6,294,311, and U.S. Pat. No. 6,352,812; and Savariar-Hauck, U.S. Pat. No. 6,358,669.

Despite the advantages that have been made in the development of multi-layer thermally imageable elements, elements in which the top layer has increased resistance to damage during handling would be desirable. The top layer of a multi-layer, thermally imageable element is sensitive to mechanical damage. It may, for example, be easily scuffed or scratched away when the imageable element is transported with suction cups in a platesetter or when it is transported to a customer location. Because of the low coating weight for the top layer (about 0.7 $g/m^2$), a shallow scratch is sufficient to break through the thin top layer. Because the underlayer is readily soluble and/or penetrable by the developer, the regions of the underlayer exposed by the scuffs and scratches will be removed by the developer. The plate rejection rate for multi-layer thermally imageable elements due to this failure mode can be high relative to that for single layer, thermally imageable elements, in which the top layer is much thicker. Thus, a need exists for positive working, multi-layer, thermally imageable elements that have increased resistance to damage during handling.

SUMMARY OF THE INVENTION

In one aspect, the invention is a positive working, multi-layer, thermally imageable element that has increased resistance to damage during handling. The imageable element comprises, in order:

a substrate having a hydrophilic surface, an underlayer comprising a first polymeric material over the hydrophilic surface of the substrate, and a top layer comprising a second polymeric material over the underlayer, in which:

the top layer is ink receptive and insoluble in an alkaline developer; and the top layer and the underlayer are each removable by the alkaline developer following thermal imaging of the element; and the second polymeric material is selected from the group consisting of:

(a) solvent soluble novolac resins that have a weight average molecular weight of at least 10,000, derivatives thereof in which the novolac resin is functionalized with polar groups, and derivatives thereof in which the novolac resin is functionalized with quadruple hydrogen bonding entities;

(b) solvent soluble m-cresol/p-cresol novolac resins that comprise at least 10 mol % p-cresol and have a weight average molecular weight of at least 8,000, derivatives thereof in which the novolac resin is functionalized with polar groups, and derivatives thereof in which the novolac resin is functionalized with quadruple hydrogen bonding entities; and (c) mixtures thereof.

In another aspect, the element additionally comprises a photothermal conversion material. In another aspect, the invention is a method for forming an image by imaging and developing the element. In yet another aspect, the invention is an image, useful as a lithographic printing plate, formed by imaging and developing the element.

DETAILED DESCRIPTION OF THE INVENTION

Unless the context indicates otherwise, in the specification and claims, the terms novolac resin, first polymeric material, second polymeric material, photothermal conversion material, coating solvent, and similar terms also include mixtures of such materials. Unless otherwise specified, all percentages are percentages by weight. "Solvent soluble" means that the novolac resin is sufficiently soluble in a coating solvent to produce a coating solution. "Weight average molecular weight" refers to weight average molecular weights determined by size exclusion chromatography.

Imageable Elements

In one aspect, the invention is a thermally imageable element. The element comprises a substrate, an underlayer, and a top layer. Optionally, a barrier layer and/or an absorber layer may be between the underlayer and the top layer. The element also comprises a photothermal conversion material, which may be in the top layer, the underlayer and/or the absorber layer. The top layer comprises a novolac resin and/or a derivatized novolac resin, as described below.

Substrate

The substrate has at least one hydrophilic surface. It comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m. Typically, the substrate comprises an interlayer between the aluminum support and the top layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and top layer) may be coated with an antistatic agent and/or a slipping layer or matte layer to improve handling and "feel" of the imageable element.

Underlayer

The underlayer is between the hydrophilic surface of the substrate and the top layer. After imaging, it is removed by the developer to expose the underlying hydrophilic surface of the substrate. It is preferably soluble in the alkaline developer to prevent sludging of the developer.

The underlayer comprises a first polymeric material. The first polymeric material is preferably soluble in an alkaline developer. In addition, the first polymeric material is preferably insoluble in the solvent used to coat the top layer so that the top layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; methacrylamides, especially methacylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in a methyl lactate/methanol/dioxolane (15:42.5:42.5 wt %) mixture, which can be used as the coating solvent for the underlayer. However, they are poorly soluble in solvents such as acetone, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the first polymeric material are alkaline developer soluble copolymers that comprise a monomer that has a urea bond in its side chain (i.e., a pendent urea group), such as are disclosed in Ishizuka, U.S. Pat. No. 5,731,127. These copolymers comprise about 10 to 80 wt %, preferably about 20 to 80 wt %, of one of more monomers represented by the general formula:

$$CH_2{=}C(R){-}CO_2{-}X{-}NH{-}CO{-}NH{-}Y{-}Z,$$

in which R is —H or —$CH_3$; X is a bivalent linking group; Y is a substituted or unsubstituted bivalent aromatic group; and Z is —OH, —COOH, or —$SO_2NH_2$.

R is preferably —$CH_3$. Preferably X is a substituted or unsubstituted alkylene group, substituted or unsubstituted phenylene [$C_6H_4$] group, or substituted or unsubstituted naphthalene [$C_{10}H_6$] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

$$CH_2{=}C(CH_3){-}CO_2{-}CH_2CH_2{-}NH{-}CO{-}NH\text{-p-}C_6H_4{-}Z,$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)-methacrylamide N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, one polymeric material has a one-minute soak loss of less than about 20%, more preferably less than about 10%, and most preferably less than about 5% in 80 wt % diacetone alcohol/20 wt % water, and the other polymeric material has a one-minute soak loss of less than about 20%, more preferably less than about 10%, and most preferably less than about 10%, in 80 wt % 2-butoxyethanol/20 wt % water. One-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

The ability of an underlayer to withstand both fountain solution and aggressive washes can be estimated by a chemical resistance parameter (CRP), defined as follows:

$$CRP=[(100-a)(100-b)]/10^4$$

in which:

a is the one minute % soak loss in 80 wt % diacetone alcohol/20 wt % water; and b is the one-minute % soak loss in 80 wt % 2-butoxyethanol/20 wt % water.

The chemical resistance parameter should be greater than about 0.4, preferably greater than about 0.5, more preferably greater than about 0.6. In favorable cases, a chemical resistance parameter of at least about 0.65 can be obtained. The one-minute soak loss in each solvent should be less than about 60%, preferably less than about 40%, and more preferably less than about 35%. Preferably, the one-minute soak loss should be less than about 60%, preferably less than about 40%, and more preferably less than about 35%, in one solvent and less than about 40%, more preferably less than about 30%; and more preferably less than about 20%, and most preferably less than about 10% in the other solvent.

Combination of (1) a copolymer that comprises N-substituted maleimides, especially N-phenylmaleimide; methacrylamides, especially methacylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprise N-(p-aminosulfonylphenyl) methacrylamide, N-(m-aminosulfonylphenyl) methacrylamide N-(o-aminosulfonylphenyl) methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight of these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight of these two polymeric materials in the underlayer. These materials together typically comprise at least about 50 wt %, preferably at least about 60 wt %, and more preferably at least about 65 wt %, of the underlayer, based on total weight of the materials in the underlayer. When present, up to about 20 wt %, preferably about 1 to about 20 wt %, other polymeric materials may be present in the underlayer, based on the total amount of all the polymeric materials in the underlayer.

Photothermal Conversion Material

The element comprises a photothermal conversion material. The photothermal conversion material may be present in the top layer, the underlayer, a separate absorber layer, or a combination thereof. To minimize ablation of the top layer during imaging with an infrared laser, the photothermal conversion material is preferably in the underlayer and/or a separate absorber layer, and the top layer is substantially free of photothermal conversion material.

Photothermal conversion materials absorb radiation and convert it to heat. Photothermal conversion materials may absorb ultraviolet, visible, and/or infrared radiation and convert it to heat. Although the novolac resin may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrilium, cyanine, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful cyanine dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-cyclopenten-1-yl]-ethenyl]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and IR Dye A and IR Dye B, whose structures are shown below.

IR Dye A

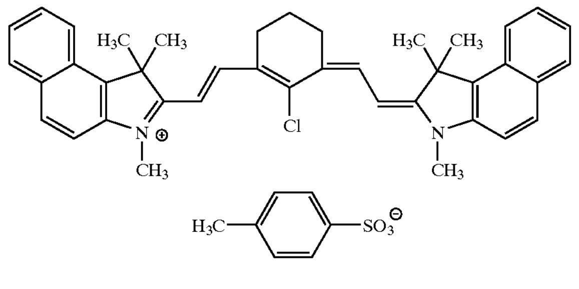

-continued

IR Dye B

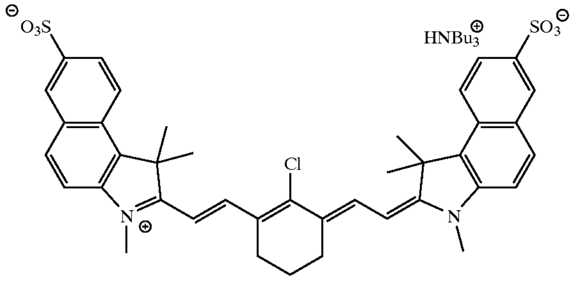

The amount of photothermal conversion material in the element is generally sufficient to provide an optical density of at least 0.05, and preferably, an optical density of from about 0.5 to about 2 at the imaging wavelength. The amount of an absorber required to produce a particular optical density can be determined from the thickness of the layer and the extinction coefficient of the absorber at the wavelength used for imaging using Beers law.

Top Layer

The top layer is ink receptive and protects the underlying layer or layers from the developer. It is insoluble in the developer prior to imaging. However, imaged regions of the top layer are removable by a developer after thermal imaging. Though not being bound by any theory or explanation, it is believed that thermal imaging causes the top layer to more readily dissolve or disperse in the aqueous developer and/or weakens the bond between the top layer and the underlayer, or, if present, the absorber layer or barrier layer. This allows the developer to penetrate the top layer, the absorber layer or barrier layer, if present, and the underlayer, and remove these layers in the imaged regions, revealing the underlying hydrophilic surface of the hydrophilic substrate.

Second Polymeric Material

The top layer comprises a second polymeric material. The second polymeric material is a novolac resin, a functionalized novolac resin, or a mixture thereof. The second polymeric material is selected from:

solvent soluble novolac resins that have a weight average molecular weight of at least 10,000;

solvent soluble novolac resins that have a weight average molecular weight of at least 10,000, functionalized with polar groups;

solvent soluble novolac resins that have a weight average molecular weight of at least 10,000, functionalized with quadruple hydrogen bonding entities;

solvent soluble m-cresol/p-cresol novolac resins that comprise at least 10 mol % p-cresol and have a weight average molecular weight of at least 8,000;

solvent soluble m-cresol/p-cresol novolac resins that comprise at least 10 mol % p-cresol and have a weight average molecular weight of at least 8,000, functionalized with polar groups;

solvent soluble m-cresol/p-cresol novolac resins that comprise at least 10 mol % p-cresol and have a weight average molecular weight of at least 8,000, functionalized with quadruple hydrogen bonding entities; and mixtures thereof.

Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. Typical novolac resins include, for example, phenol-formaldehyde resins, cresol-formaldehyde resins, phenol-cresol-formaldehyde resins, p-t-butylphenol-formaldehyde resins, and pyrogallol-acetone resins.

A solvent soluble novolac resin is one that is sufficiently soluble in a coating solvent to produce a coating solution that can be coated to produce a top layer. The novolac resin preferably has the highest possible weight average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of at least 10,000, typically at least 13,000, especially at least 15,000 and more especially at least 18,000, and even more especially 25,000, have excellent ability to withstand scuffing. Top layers comprising m-cresol/p-cresol novolac resins with at least 10 mol % p-cresol, having a weight average molecular weight of at least 8,000, especially at least 10,000, more especially at least 25,000, have excellent ability to withstand scuffing.

The ability of the top layer to withstand scuffing reaches a plateau at a molecular weight of about 15,000 for novolac resins prepared from m-cresol. The scuff resistance of top layers comprising 100% m-cresol novolac resins having molecular weights of 34,000, 36,000 and 45,000 is similar to that of a top layer containing a 100% m-cresol novolac resin with a molecular weight of 15,000. However, the higher molecular weight resins are less soluble in common organic solvents than the lower molecular weight novolac resin. For novolac resins that comprise from 10% to 50% p-cresol, the scuff resistance reaches a plateau at around at a molecular weight of about 20,000.

The m-cresol/p-cresol novolac resins are prepared by condensation of a mixture of m-cresol and p-cresol with an aldehyde or ketone, preferably formaldehyde, or a formaldehyde precursor such as paraformaldehyde. Although small amounts of other phenols may be present in the reaction mixture used to prepare the m-cresol/p-cresol novolac resin as, for example, impurities in the m-cresol and the p-cresol, m-cresol and p-cresol will typically comprise at least about 97 mol % of the phenols present in the novolac resin.

The m-cresol/p-cresol novolac resin comprises at least 10 mol % p-cresol based on the amount of m-cresol and p-cresol in the resin, i.e., at least 10 mol % of the m-cresol and p-cresol used to form the novolac resin is p-cresol. Preferably, the resin comprises at least 30 mol % p-cresol, based on the total amount of m-cresol and p-cresol in the resin. Novolac resins comprising at least 10 mol % p-cresol have increased ability to withstand scuffing, over m-cresol-only (at least 97 mol % m-cresol) novolac resins of similar molecular weight. Preferably, the m-cresol/p-cresol novolac resin comprises 10 to 60% p-cresol, even more preferably around 30 to 40% p-cresol. Increasing levels of p-cresol beyond 60% has negligible improvement and may even diminish the ability to withstand scuffing.

Novolac resins prepared by solvent condensation produce top layers that have greater ability to withstand scuffing than top layers prepared from similar resins prepared by hot melt condensation. While not being bound by any theory or explanation, it is believed that novolac resins produced by the solvent condensation method have less branching and smaller polydispersity than novolac resins produced by the hot melt condensation process.

The novolac resins of the invention produce top layers that have further improved ability to withstand scuffing when they are functionalized with polar groups. Using methods well known to those skilled in the art, a portion of the hydroxyl groups can be derivatized to introduce polar groups, for example diazo groups; carboxylic acid esters, such as acetate and benzoate; phosphate esters; sulfinate esters; sulfonate esters, such as methyl sulfonate, phenyl sulfonate, p-toluene sulfonate (tosylate), 2-nitrobenzene sulfonate, and p-bromophenyl sulfonate (brosylate); and ethers, such as phenyl ether.

One group of second polymeric materials that comprise polar groups are derivatized novolac resins in which a portion of the phenolic hydroxyl groups have been converted to -T-Z groups, in which T is a polar group, especially a carbonyl group, a sulfonyl group, or sulfinyl group, and Z is another, non-diazide functional group. These compounds are disclosed in WO 99/01795 and McCullough, U.S. Pat. No. 6,218,083, especially at column 9, line 1, to column 10, line 46. Z is typically an optionally substituted alkyl, alkenyl, alkynyl, cycloalkyl, aryl, heteroaryl, non-aromatic heterocyclic, aralkyl or heteroaralkyl group. Preferred aryl groups are a phenyl and naphthyl, optionally substituted by 1–3 functional groups independently selected from hydroxy, halo, $C_{1-4}$ alkyl (especially methyl), $C_{1-4}$ haloalkyl (especially $CF_3$), $C_{1-4}$ alkoxy (especially methoxy), amino, mono-($C_{1-4}$ alkyl) amino (especially methylamino) and di-($C_{1-4}$ alkyl) amino (especially dimethylamino). Especially preferred aryl groups are naphthyl, dansyl, phenyl and 4-methylphenyl. An especially preferred optionally substituted alkyl group is the $C_{2-8}$ alkyl group, especially the n-$C_{3-6}$ alkyl group. These derivatized novolac resins may be prepared by reaction of the novolac resin with the appropriate acid chloride, such as acetyl chloride, benzoyl chloride, 10-camphor sulfonyl chloride, phenyl sulfonyl chloride, methyl sulfonyl chloride, 2-nitrobenzene sulfonyl chloride, etc., in the presence of a base such as a tertiary amine, for example, triethyl amine, 4-methylmorpholine, or diazabicyclooctane.

Another group of second polymeric materials that comprise polar groups are derivatized novolac resins in which a portion of the phenolic hydroxyl groups have been derivatized with diazo groups containing o-naphthoquinone moieties. These polar group containing derivatized novolac resins can be formed, for example, by reaction of a reactive derivative that contains a diazonaphtho-quinone moiety with a novolac resin. Derivatization of novolac resins with compounds that contain the diazonaphthoquinone moiety is well known in the art and is described, for example, in West, U.S. Pat. Nos. 5,705,308, and 5,705,322, and in Chapter 5 of Photoreactive Polymers: the Science and Technology of Resists, A. Reiser, Wiley, New York, 1989, pp. 178–225. Representative reactive derivatives include sulfonic and carboxylic acid compounds that comprise the diazonaphthoquinone moiety and their esters, amides, and acid halides. Preferred compounds are the sulfonyl chlorides and esters. Most preferred are sulfonyl chlorides, such as 2-diazo-1,2-dihydro-1-oxo-5-naphthalenesulfonyl chloride; and 2-diazo-1,2-dihydro-1-oxo-4-naphthalenesulfonyl chloride.

Derivatization of the hydroxyl groups of the novolac resin increases its molecular weight and reduces the number of hydroxyl groups, typically reducing both the solubility and the rate of dissolution of the novolac resin in the developer.

Although the degree of derivatization required will depend on the nature of the novolac resin and the nature of the moiety containing the polar groups introduced into the novolac resin, typically the ratio of functional groups to hydroxyl groups will be in the range of 1:100 to 1:2, more typically in the range of 1:50 to 1:3, even more typically in the range of 1:20 to 1:6.

A QHB-modified novolac resin comprises a structural feature, or QHB (quadruple hydrogen bonding) unit, that is capable of forming four or more, typically four, hydrogen bonds with similar or complementary units on other molecules or portions of molecules. A QHB unit is a unit that can be linked via at least four hydrogen bonds to another QHB unit. Polymeric molecules that, in pairs, form at least four hydrogen bonds with one another are disclosed in Sijbesma, U.S. Pat. No. 6,320,018, incorporated herein by reference. The QHB units preferably have an essentially flat, rigid structure. In particular, the unit preferably contains one or more flat six-membered rings. Preferably, the QHB units have two successive donors, followed by two acceptors. In one preferred embodiment, the QHB units are isocytosine units (isocytosine moieties) and the QHB-modified polymeric molecules comprise at least two isocytosine units.

A QHB-modified polymer can be prepared by reaction of, for example, an isocytosine such as a 6-alkyl isocytosine, typically 6-methyl isocytosine, with an isocyanate to produce an isocytosine/isocyanate mono-adduct, i.e. a quadruple hydrogen bonding entity (QHBE). The quadruple hydrogen bonding entity is reacted with the appropriate polymer to produce the QHB-modified polymer. The 6-methyl isocytosine/isocyanate mono-adduct, a QHBE, is represented by the formula:

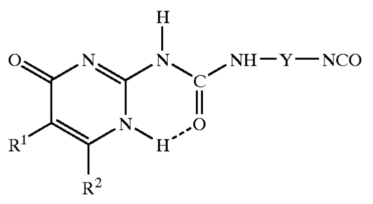

in which $R^1$ is hydrogen, $R^2$ is methyl, and Y is a hydrocarbylene group derived from a diisocyanate represented by the formula $Y(NCO)_2$.

Any diisocyanate may be used to prepare the QHBE. Suitable diisocyanates include, for example, isophorone diisocyanate, methylene-bis-phenyl diisocyanate, toluene diisocyanate, hexamethylene diisocyanate, tetramethylxyxylene diisocyanate, dimers thereof, adducts thereof with diols, and mixtures thereof. A preferred diisocyanate is isophorone diisocyanate.

Reaction of one mole of the isocytosine with one mole of the diisocyanate produces the QHBE, which will spontaneously dimerize to form a dimeric mono-adduct joined by four thermally reversible hydrogen bonds. The resulting dimeric QHBE has a free isocyanate group on each end, which can react with the novolac resin to produce a QHB-modified novolac resin.

Unreacted diisocyanate in the QHBE can crosslink the polymer by reaction with two molecules of the polymer. To avoid crosslinking of the unmodified polymer by unreacted diisocyanate, an excess of isocytosine, i.e., about 10–20% molar excess, is preferably used. However, excess isocytosine can further react with the QHBE to give an adduct having two isocytosine units. To maximize the formation of lower order adducts, isocytosine is added slowly to the diisocyanate so that excess diisocyanate is present at the early stages of the QHBE formation reaction.

Dissolution Inhibitor

The top layer may comprise a dissolution inhibitor. The dissolution inhibitors are believed not to be photoreactive to radiation in the range of about 600 nm to about 800 nm or to radiation in the range of about 800 nm to about 1200 nm, the ranges of radiation typically used for imaging thermally imageable elements. Such systems are disclosed in, for example, Parsons, U.S. Pat. No. 6,280,899, Nagasaka, EP 0 823 327; Miyake, EP 0 909 627; West, WO 98/42507; and Nguyen, WO 99/11458.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds containing other polar groups, such as ether, amine, azo, nitro, ferrocenium, sulfoxide, sulfone, and disulfone may also be useful as dissolution inhibitors. Monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, beta-ketoesters or beta-ketoamides may also be useful as dissolution inhibitors.

Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds.

Quaternized heterocyclic compounds are useful as dissolution inhibitors. Representative imidazolium compounds include Monazoline C, Monazoline O, Monazoline CY, and Monazoline T, all of which are manufactured by Mona Industries. Representative quinolinium dissolution inhibitors include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl) benzothiazolium cationic dyes and 3-ethyl-2-methylbenzothiazolium iodide. Suitable pyridinium dissolution inhibitors include cetyl pyridinium bromide and ethyl viologen dications. Diazonium salts are useful as dissolution inhibitors and include, for example, substituted and unsubstituted diphenylamine diazonium salts, such as methoxy-substituted diphenylamine diazonium hexafluoroborates.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element.

When a dissolution inhibitor is present in the top layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, a novolac resin that comprises o-diazonaphthoquinone moieties or other polar groups, such as is discussed above, can act as both the second polymeric material and the dissolution inhibitor. Derivatization of novolac resins with polar groups is described above. A dissolution inhibitor is typically not used when the novolac resin is derivatized with QHB entities.

Other Layers

When present, the absorber layer is between the top layer and the underlayer. The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of the first polymeric material. The surfactant may be present to help disperse the photothermal conversion material in a coating solvent.

The thickness of the absorber layer is generally sufficient to absorb at least 90%, preferably at least 99%, of the imaging radiation. The amount of absorber required to absorb a particular amount of radiation can be determined from the thickness of the absorber layer and the extinction coefficient of the absorber at the imaging wavelength using Beers law. Typically, the absorber layer has a coating weight of about 0.02 $g/m^2$ to about 2 $g/m^2$, preferably about 0.05 $g/m^2$ to about 1.5 $g/m^2$.

To minimize migration of the photothermal conversion material from the underlayer to the top layer during manufacture and storage of the imageable element, the element may also comprise a barrier layer between the underlayer and the top layer. The barrier layer comprises a polymeric material that is soluble in the aqueous alkaline developer. If this polymeric material is different from polymeric material in the underlayer, it is preferably soluble in at least one organic solvent in which the polymeric material in the underlayer is insoluble. The polymeric material in the underlayer and the polymeric material in the barrier layer may be the same polymeric material. A preferred polymeric material for the underlayer is polyvinyl alcohol.

When the barrier layer and the underlayer comprise the same polymeric material, the barrier layer should be least half the thickness of the underlayer and more preferably as thick as the underlayer. When the polymeric material in the barrier layer is different from the polymeric material I the underlayer, the barrier layer should be less that about one-fifth as thick as the underlayer, preferably less than a tenth of the thickness of the underlayer.

Preparation of the Imageable Elements

The thermally imageable element may be prepared by sequentially applying the underlayer over the hydrophilic surface of the substrate; applying the absorber layer or the barrier layer, if present, over the underlayer; and then applying the top layer over the underlayer, absorber layer, or barrier layer using conventional techniques.

The terms "solvent" and "coating solvent" include mixtures of solvents. They are used although some or all of the materials may be suspended or dispersed in the solvent rather than in solution. Selection of the solvents used to coat the underlayer, the absorber layer, and the top layer depends on the nature of the first polymeric material and the second polymeric material, as well as the other ingredients present in these layers, if any.

The underlayer may be applied over the hydrophilic surface by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

If present, the absorber layer may be applied over the underlayer, typically to the surface of the underlayer, by any conventional method, such as those listed above. To prevent the underlayer from dissolving and mixing with the absorber layer when the absorber layer is coated over the underlayer, the absorber layer is preferably coated from a solvent in which the first polymeric material is essentially insoluble. Thus, if the photothermal conversion material is a dye, the coating solvent for the absorber layer should be a solvent in which the photothermal conversion material is sufficiently soluble that the absorber layer can be formed and in which the novolac resin and the other components of the underlayer, if any, are essentially insoluble. If the photothermal conversion material is a pigment, a dispersion of the pigment in a solvent such as water in which the novolac resin and the other components of the underlayer, if any, are essentially insoluble may be coated over the underlayer to form the absorber layer. If the photothermal conversion material is a sublimable dye, the absorber layer may be deposited by sublimation of the photothermal conversion material onto the underlayer.

The top layer is applied over the underlayer or, if present, over the absorber layer. To prevent these layers from dissolving and mixing with the top layer when the top layer is coated, the top layer should be coated from a solvent in which these layers are essentially insoluble. Thus, the coating solvent for the top layer should be a solvent in which the polymeric material in the top layer is sufficiently soluble that the top layer can be formed and in which the materials in the other layers are essentially insoluble. Typically the materials in these layers are soluble in more polar solvents and insoluble in less polar solvents so that the solvent or solvents used to coat these layers is more polar than the solvent used to coat the top layer. Consequently, the top layer can typically be coated from a conventional organic solvent such as toluene or 2-butanone. An intermediate drying step, i.e., drying the underlayer or, if present, the absorber layer, to remove coating solvent before coating the top layer over it, may also be used to prevent mixing of the layers. Alternatively, the underlayer, the top layer or both layers may be applied by conventional extrusion coating methods from a melt mixture of layer components. Typically, such a melt mixture contains no volatile organic solvents.

Imaging and Processing

Thermal imaging of the thermally imageable element may be carried out by well-known methods. The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, typically at 830 nm or 1064 nm, is typically used for imaging thermally imageable elements. Imaging is conveniently carried out with a laser emitting at about 830 nm or at about 1064 nm. Suitable commercially available imaging devices include image setters such as the Creo Trendsetter (CREO) and the Gerber Crescent 42T (Gerber).

Alternatively, the thermally imageable element may be thermally imaged using a conventional apparatus containing a thermal printing head. An imaging apparatus suitable for use in conjunction with thermally imageable elements includes at least one thermal head but would usually include a thermal head array, such as a TDK Model No. LV5416 used in thermal fax machines and sublimation printers or the GS618-400 thermal plotter (Oyo Instruments, Houston, Tex., USA).

Imaging produces an imaged element, which comprises a latent image of imaged (exposed) regions and unimaged (unexposed) regions. Development of the imaged element to form a printing plate, or printing form, converts the latent image to an image by removing the imaged (exposed) regions, revealing the hydrophilic surface of the underlying substrate. When the top layer comprises a QHB modified novolac resin, the imaged element should preferably be developed within up to 1 hour, more preferably within up to 30 minutes, most preferably within up to 10 minutes after imaging.

The developer may be any liquid or solution that can penetrate and remove the imaged regions of the top layer, the underlying regions of, if present, the absorber layer or barrier layer, and the underlying regions of the underlayer without substantially affecting the complimentary unimaged regions. Development is carried out for a long enough time to remove the imaged regions of the top layer, the underlying regions of, if present, the absorber layer or barrier layer, and the underlying regions of the underlayer in the developer, but not long enough to remove the unimaged regions of the top layer. Hence, the imaged regions are described as being "soluble" or "removable" in the developer because they are removed, and dissolved and/or dispersed, more rapidly in the developer than the unimaged regions. Typically, the underlayer is dissolved in the developer, the absorber layer is either dissolved or dispersed in the developer, and the top layer is dispersed in the developer.

Useful developers are aqueous solutions having a pH of about 7 or above and solvent based alkaline developers. Common components of developers are surfactants; chelating agents, such as salts of ethylenediamine tetraacetic acid; organic solvents such as benzyl alcohol and phenoxyethanol; and alkaline components such as inorganic metasilicates, organic metasilicates, hydroxides or bicarbonates. Typical aqueous alkaline developers are those that have a pH between about 8 and about 13.5, typically at least about 11, preferably at least about 12.

The developer may also comprise a surfactant or a mixture of surfactants. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The surfactant or mixture of surfactants typically comprises about 0.5 wt % to about 15 wt % based on the weight of the developer, preferably about 3 wt % to about 8 wt %, based on the weight of the developer. As is well known to those skilled in the art, many surfactants are supplied as aqueous surfactant solutions. These percentages are based on the amount of surfactant (i.e. the amount of active ingredient or ingredients exclusive of water and other inactive materials in the surfactant solution) in the developer.

A developer may also comprise a buffer system to keep the pH relatively constant, typically between about 5.0 and about 12.0, preferably between about 6.0 and about 11.0, more preferably between about 8.0 and about 10.0. Numerous buffer systems are known to those skilled in the art. Typically buffer systems include, for example: combinations of water-soluble amines, such as mono-ethanol amine, diethanol amine, tri-ethanol amine, or tri-i-propyl amine, with a sulfonic acid, such benzene sulfonic acid or 4-toluene sulfonic acid; mixtures of the tetra sodium salt of ethylenediaminetetraacetic acid (EDTA) and EDTA; mixtures of phosphate salts, such as mixtures of mono-alkali phosphate salts with tri-alkali phosphate salts; and mixtures of alkali borates and boric acid. Water typically comprises the balance of $he developer.

Surprisingly, solvent-based alkaline developers, which are typically used with negative working imageable elements, are excellent developers for use with the positive working, multi-layer, thermally imageable elements of this invention. Solvent-based developers comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer.

Useful commercially available aqueous alkaline developers include 3000 Developer and 9000 Developer, and useful commercially available solvent-based developers include 956 Developer and 955 Developer, all available from Kodak Polychrome Graphics, Norwalk, Conn., USA.

The developer is typically applied to the precursor by spraying the element with sufficient force to remove the exposed regions. Alternatively, development may be carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example cellulose, polyvinylalcohol, polymethacrylic acid, polymethacrylamide, polyvinylmethylether, polyhydroxyethylmethacrylate, gelatin, and polysaccharide such as dextran, pullulan, gum arabic, and alginic acid. A preferred material is gum arabic.

A developed and gummed plate may also be baked to increase the run length of the plate. Baking can be carried out, for example at about 220° C. to about 240° C. for about 7 minutes to 10 minutes, or at a temperature of 120° C. for 30 minutes.

INDUSTRIAL APPLICABILITY

The imageable elements of the invention are useful as lithographic printing plate precursors. They have increased scuff resistance and thus are less susceptible to damage during handling.

Once the imageable element has been imaged and processed to form a printing plate, printing can be carried out by applying a fountain solution and then a lithographic ink to the image on its surface. Fountain solution is taken up by the exposed regions, i.e., the surface of the substrate exposed by imaging and development, and the ink is taken up by the unexposed regions. The ink is transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution. "Molecular weight" refers to weight average molecular weight measured by size exclusion chromatography.

| Glossary | |
|---|---|
| 956 Developer | Solvent-based (phenoxyethanol) alkaline developer (Kodak Polychrome Graphics, Norwalk, CT, USA) |
| 2531-35 | Novolac resin, 50% m-cresol/50% p-cresol; MW 5,000 (Borden Chemical, Louisville, KY, USA) |
| 2531-36 | Novolac resin, 50% m-cresol/50% p-cresol; MW 9,900 (Borden Chemical, Louisville, KY, USA) |
| 2539-22 | Novolac resin, 50% m-cresol/50% p-cresol; MW 14,000 (Borden Chemical, Louisville, KY, USA) |
| 2539-23 | Novolac resin; 50% m-cresol/50% p-cresol; MW 21,350 (Borden Chemical, Louisville, KY, USA) |
| Binder A | Copolymer of N-phenylmaleimide, methacrylamide, and methacrylic acid (45:35:20 mol %) |
| BLE0334A | Novolac resin; 100% m-cresol; MW 34,000, manufactured by solvent condensation (Eastman Kodak, Rochester, NY, USA) |
| BLE0334B | Novolac resin; 100% m-cresol; MW 36,000, manufactured by solvent condensation (Eastman Kodak, Rochester, NY, USA) |
| BLE0334C | Novolac resin; 100% m-cresol; MW 45,000, manufactured by solvent condensation (Eastman Kodak, Rochester, NY, USA) |
| BLE0337C | Novolac resin; 70% m-cresol/30% p-cresol; MW 18,000, manufactured by solvent condensation (Eastman Kodak, Rochester, NY, USA) |
| BLE390B | Novolac resin; 70% m-cresol/30% p-cresol; MW 45,000, manufactured by solvent condensation (Eastman Kodak, Rochester, NY, USA) |
| BLE378B | Novolac resin; 70% m-cresol/30% p-cresol; MW 63,800, manufactured by solvent condensation (Eastman Kodak, Rochester, NY, USA) |
| Calendered Interleaf | Twenty-five pound, unbleached, natural calendered Kraft paper (Thilmany, Kaukauna, WI, USA) |
| CN139 | N13 novolac resin functionalized with 9 mol % 215 naphthoquinone diazide sulfonyl chloride, as described in WO99/01795 |
| DIC ZH8036 | Novolac resin; 75% m-cresol/25% p-cresol; MW 11,000 (DIC, Gunma, Japan) |

-continued

| Glossary | |
|---|---|
| Ethyl Violet | C.I. 42600; CAS 2390-59-2 ($\lambda_{max}$ = 596 nm) $[(p-(CH_3CH_2)_2NC_6H_4)_3C^+ Cl^-]$ |
| N9 | Novolac resin; 100% m-cresol; MW 9,000, manufactured by solvent condensation (Eastman Kodak, Rochester, NY, USA) |
| N13 | Novolac resin; 100% m-cresol; MW 13,000, manufactured by solvent condensation (Eastman Kodak Rochester, NY, USA) |
| Resin 1 | Resin produced by reaction of 199.75 millimoles of N-13 with 20.02 millimoles of 10-camphor sulfonyl chloride, as described below |
| Resin 2 | Resin produced by reaction of 199.75 millimoles of N-13 with 20.02 millimoles of p-toluene sulfonyl chloride, as described below |
| Resin 3 | Resin produced by reaction of 199.75 millimoles of N-13 with 20.02 millimoles of 2-nitrobenzene sulfonyl chloride as described below |
| SD126A | Novolac resin; 100% m-cresol; MW 1,700 (Borden Chemical, Louisville, KY, USA) |
| SD140A | Novolac resin; 75% m-cresol/25% p-cresol; MW 1,000 (Borden Chemical, Louisville, KY, USA) |
| SD193A | Novolac resin; 50% m-cresol/50% p-cresol; MW 3,300 (Borden Chemical, Louisville, KY, USA) |
| SD390A | Novolac resin; 100% m-cresol; MW 10,000 (Borden Chemical, Louisville, KY, USA) |
| SD494A | Novolac resin; 53% m-cresol/47% p-cresol; MW 8,000 (Borden Chemical, Louisville, KY, USA) |
| SD646A | Novolac resin; 75% m-cresol/25% p-cresol; MW 20,000, manufactured by hot melt condensation (Borden Chemical, Louisville, KY, USA) |
| Substrate A | 0.3 Gauge aluminum sheet, which had been electrograined, anodized and subject to treatment with a solution of polyvinylphosphonic acid |
| UR4376 | 2539-23 Novolac resin functionalized with 9 mol % QHB entity, as described in Example 38 |
| XKL Interleaf | Thirty pound unbleached, natural Kraft paper (Thilmany, Kaukauna, WI, USA) |

IR Dye A

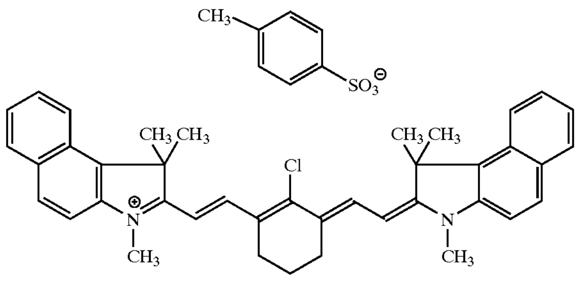

Evaluation Procedures

Drop Test A large drop of 956 Developer is placed on the top layer of each imageable element at 22° C. and the time required to dissolve the layer noted. As shown in Example 24, drop test results correlate with scuff resistance.

Scuff Test For each test, three 68.6×38.1 cm (27 by 15 inch) unexposed imageable elements are used. The elements and interleaf are loaded into the apparatus. The apparatus comprises a cardboard box of dimensions 71.1×40.6×2.5 cm (28 by 16 by 1 inches) mounted upon a commercially available ink mixer at an angle of 150 from the normal. The apparatus spins at about 2 revolutions per sec on the tilt. The box is loaded with 15 dummy elements with interleaf and then two of the samples to be tested, with interleaf. There is half inch gap around the elements, when they reside in the box. The elements are spun for one hour. The first (top element) is removed after 30 minutes and processed (in 956 Developer using a Kodak Polychrome Graphics 85 NS processor). The second element is removed at the end of the test (1 hour) and processed. The third element is processed un-spun. This is the "fresh" element. The number of scuffs on each element is counted. Results are recorded as x-y-z, where x is fresh element, y is 30 minute element and z is the one hour element.

Examples 1–6

This example shows that novolac resins with increasing p-cresol content have improved developer resistance and, hence, increased ability to withstand scuffing over a m-cresol-only novolac resin.

Underlayer A coating solution containing 85 parts by weight of binder A and 15 parts by weight of IR Dye A in 15:20:5:60 (w:w) butyrolactone:methyl ethyl ketone:water:1-methoxypropan-2-ol were coated onto substrate A using a wire wound bar. The resulting element comprising the underlayer and the substrate was dried at 100° C. for 90 seconds. The coating weight of the resulting underlayer was of 2.0 g/m$^2$.

Top Layer Coating solutions containing 96.3 parts by weight of the novolac resin, and 3.7 parts by weight of ethyl violet in diethyl ketone were coated onto the underlayer using a wire wound bar. The coating weight of the resulting top layer was of 0.7 g/m$^2$. The resulting imageable elements were dried at 100° C. for 90 seconds. The novolac resins used are shown in Table 1.

Each of the imageable elements was evaluated by the drop test. The results are shown in Table 1.

TABLE 1

| Example | Resin | % p-cresol | MW | Drop Test[a] |
|---|---|---|---|---|
| 1 | SD 390A | 0% | 10,000 | 120 sec |
| 2 | SD 140A | 25% | 7,000 | 120 sec |
| 3 | SD 193A | 50% | 3,300 | 120 sec |
| 4 | N13 | 0% | 13,000 | 360 sec |
| 5 | DIC ZH8036 | 25% | 11,000 | 360 sec |
| 6 | SD 494A | 47% | 8,000 | 360 sec |

[a]Time required for the developer to remove the layers.

Example 3 (3,300 MW novolac resin) has the same developer resistance as Example 1 (10,000 MW novolac resin). Example 3 has 50% p-cresol content character, while Example 1 has zero p-cresol content.

Example 6 (8,000 MW novolac resin) had the same developer resistance as Example 4 (13,000 MW novolac resin). Example 6 has 47% p-cresol content, while Example 4 has zero p-cresol content.

Examples 7–9

These examples show that novolac resins with increasing molecular weight have improved developer resistance and, hence, increased ability to withstand scuffing.

The procedure of Examples 1–6 was repeated except that the novolac resins indicated in Table 2 were used. Each of the resulting imageable elements was evaluated by the drop test. The results are shown in Table 2.

TABLE 2

| Example | Resin | % p-cresol | MW | Drop Test[a] |
|---|---|---|---|---|
| 7 | N13 | 0% | 13,000 | 360 sec |
| 8 | SD 390A | 0% | 10,000 | 120 sec |
| 9 | SD 126A | 0% | 1,700 | 10 sec |

[a]Time required for the developer to remove the layers.

Examples 10–13

These examples show that novolac resins with increasing molecular weight have improved developer resistance and, hence, increased ability to withstand scuffing.

The procedure of Examples 1–6 was repeated except that the novolac resins indicated in Table 3 were used. Each of the resulting imageable elements was evaluated by the drop test. The results are shown in Table 3.

TABLE 3

| Example | Resin | % p-cresol | MW | Drop Test[a] |
|---|---|---|---|---|
| 10 | 2539-23 | 50% | 21,350 | 480 sec |
| 11 | 2539-22 | 50% | 14,000 | 300 sec |
| 12 | 2531-36 | 50% | 9,900 | 240 sec |
| 13 | 2531-35 | 50% | 5,000 | 40 sec |

[a]Time required for the developer to remove the layers.

Examples 14–17

These examples show that novolac resins having zero p-cresol content reach a developer resistance plateau (and therefore the ability to withstand scuffing levels off) as molecular weight approaches and exceeds 15,000.

The procedure of Examples 1–6 was repeated except that the novolac resins indicated in Table 4 were used. Each of the resulting imageable elements was evaluated by the drop test. The results are shown in Table 4.

TABLE 4

| Example | Resin | % p-cresol | MW | Drop Test[a] |
|---|---|---|---|---|
| 14 | N13 | 0% | 13,000 | 360 sec |
| 15 | BLE0334A | 0% | 34,000 | 360 sec |
| 16 | BLE0334B | 0% | 36,000 | 360 sec |
| 17 | BLE0334C | 0% | 45,000 | 360 sec |

[a]Time required for the developer to remove the layers.

Examples 18 and 19

These examples show that a novolac resin prepared by a solvent condensation route has a greater ability to resist developer and, hence, increased ability to withstand scuffing than a novolac resin prepared by a hot melt condensation route.

The procedure of Examples 1–6 was repeated except that the novolac resins indicated in Table 5 were used. Each of the resulting imageable elements was evaluated by the drop test. The results are shown in Table 5.

TABLE 5

| Example | Resin | % p-cresol | MW | Drop Test[a] |
|---|---|---|---|---|
| 18 | BLE0337C | 30% | 18,000 | 480 sec |
| 19 | SD 646A | 25% | 20,000 | 360 sec |

[a]Time required for the developer to remove the layers.

Examples 20 to 23

These examples show that novolac resins functionalized as described in these examples have improved ability to resist developer and, hence, increased ability to withstand scuffing.

The procedure of Examples 1–6 was repeated except that the novolac resins and functionalized novolac resins indicated in Table 6 were used. Each of the resulting imageable elements was evaluated by the drop test. The results are shown in Table 6.

TABLE 6

| Example | Resin | % p-cresol | MW | Drop Test[a] |
|---|---|---|---|---|
| 20 | N13 | 0% | 13,000 | 360 sec |
| 21 | CN139 | 0% | 13,000 | 420 sec |
| 22 | 2539-23 | 50% | 21,350 | 480 sec |
| 23 | UR4376 | 50% | | 600 sec |

[a]Time required for the developer to remove the layers.

Example 24

This example shows that drop test results correlate with scuff resistance.

Three imageable elements of each of Examples 2, 4, 5 and 6 prepared as described above. The imageable elements were subjected to the Scuff Test. The results are shown Table 7.

TABLE 7

| Interleaf Type | Example | Novolac Resin | Drop Test Result | Scuff Test Result[a] |
|---|---|---|---|---|
| XKL | 2 | SD 140A | 120 sec | 14-28-86 |
| XKL | 4 | N13 | 360 sec | 2-3-7 |
| XKL | 5 | DIC ZH8036 | 360 sec | 1-4-15 |
| XKL | 6 | SD 494A | 360 sec | 1-8-8 |
| Calendered | 2 | SD 140A | 120 sec | 8-10-50 |
| Calendered | 6 | SD 494A | 360 sec | 0-0-0 |

[a]Number of scuffs on a fresh imageable element, on an imageable element that had been spun for 0.5 hr, and on an imageable element that had been spun for 1 hr, respectively.

Example 25

Imageable elements of each of the Examples 2, 4, 15, 16, 17, 18, 21 and 23 were imagewise exposed with 830 nm radiation with an internal test pattern (plot 12), on a Creo 3230 Trendsetter at 60 to 200 $mJ/cm^2$, in 20 $mJ/cm^2$ increments (at 9 W). The Creo Trendsetter 3230 is a commercially available platesetter, using Procom Plus software and operating at a wavelength of 830 nm (Creo Products, Burnaby, BC, Canada). The samples were then machine processed with 956 Developer in a Kodak Polychrome Graphics 85 NS Processor. The results are shown in Table 8.

TABLE 8

| Example | Minimum exposure required ($mJ/cm^2$) | Resolution at 150 lines per inch |
|---|---|---|
| 2 | 100 | 2 to 98% |
| 4 | 100 | 2 to 98% |
| 15 | 100 | 2 to 98% |
| 16 | 100 | 2 to 98% |
| 17 | 100 | 2 to 98% |
| 18 | 110 | 2 to 98% |
| 21 | 100 | 2 to 98% |
| 23 | 120 | 2 to 98% |

Thus, for all examples tested, excellent copies of the imaging pattern were achieved at 120 $mJ/cm^2$ or less.

Examples 26 to 29

These examples show that novolac resins functionalized as described in these examples have improved ability to resist developer and thus resist scuffing.

The procedure of Examples 1–6 was repeated except that the functionalized novolac resins indicated in Table 9 were used. Each of the resulting imageable elements was evaluated by the drop test. The results are shown in Table 9.

TABLE 9

| Example | Resin | Drop Test[a] |
|---|---|---|
| 26 | Resin 1 | 580 sec |
| 27 | Resin 2 | 420 sec |
| 28 | Resin 3 | 420 sec |
| 29 | N13 | 360 sec |

[a]Time required for the developer to remove the layers.

Examples 30 to 32

These examples show that novolac resins having increased p-cresol content have improved developer resistance and, hence, increased ability to withstand scuffing.

The procedure of Examples 1–6 was repeated except that the novolac resins indicated in Table 10 were used. Each of the resulting imageable elements was evaluated by the drop test. The results are shown in Table 10.

TABLE 10

| Example | Resin | % p-cresol | MW | Drop Test[a] |
|---|---|---|---|---|
| 30 | BLE390B | 30% | 45,000 | 540 sec |
| 31 | BLE378B | 30% | 63,800 | 480 sec |
| 32 | N13 | 0% | 13,000 | 360 sec |

[a]Time required for the developer to remove the layers.

Examples 33 to 34

These examples show that a novolac resin prepared by a solvent condensation route has a greater ability to resist developer and thus resist scuffing than a novolac resin prepared by a hot melt condensation route.

The procedure of Examples 1–6 was repeated except that the novolac resins indicated in Table 11 were used. Each of the resulting imageable elements was evaluated by the drop test. The results are shown in Table 11.

TABLE 11

| Example | Resin | % p-cresol | MW | Drop Test[a] |
|---|---|---|---|---|
| 33 | SD39OA | 0% | 10,000 | 120 sec |
| 34 | N9 | 0% | 9,000 | 300 sec |

[a]Time required for the developer to remove the layers.

Example 35

This example describes the preparation of Binder A. Methyl glycol (800 mL) was placed in a 1 L round-bottomed flask equipped with a stirrer, thermometer, nitrogen inlet and reflux condenser. Methacrylic acid (27.1 g), N-phenylmaleimide (183.7 g), and methacrylamide (62.5 g) added and dissolved with stirring. 2,2-Azobisisobutyronitrile (AIBN) (3.4 g) was added and the reaction mixture heated at 60° C. with stirring for 22 hr. Then methanol was added, and the precipitated copolymer filtered, washed twice with methanol, and dried in the oven at 40° C. for 2 days.

Other copolymers of this type can be prepared by this procedure, For example, reaction of methacrylic acid (27.1 g), N-phenylmaleimide (183.7 g), methacrylamide (62.5 g), and AIBN (3.4 g) forms a copolymer that contains N-phenylmaleimide, methacrylamide, and methacrylic acid in a 50:35:15 mol % ratio.

If the polymerization is carried out in 1,3-dioxolane, in some cases reprecipitation can be avoided. The monomers are soluble in 1,3-dioxolane, but the polymer is insoluble and precipitates during the reaction.

Example 36

This example gives the procedure for the preparation of Resin 1, Resin 2, and Resin 3.

Add N-13 (24 g, 199.75 millimoles) to acetone (66 g) with stirring, cool to 10° C. in ice/water bath. Over a one minute period at 10° C., add the sulfonyl chloride (20.02 millimoles). Over a two minute period at 10° C., add triethylamine (19.63 millimoles). Stir for 10 minutes at less than 15° C. Over a 10 second period at 10° C., add acetic acid (8.33 millimoles), then stir for 15 minutes. Mix water/ice (160 g), and acetic acid (1.2 g, 20.02 millimoles) and stir for 1 minutes at 15° C. Add the acidified water/ice mix to the reaction mixture over several minutes. Stir for 5 additional minutes. Ensure temperature stays below 15° C. A tacky gooey mass should form. Decant supernatant. Add acetone (354 g) to the taffy, stir until a clear solution is obtained. Mix additional water/ice (160 g), and acetic acid (1.2 g, 20.02 millimoles) and stir for 1 minutes at 15° C. Add the acidified water/ice mix to the reaction mixture over several minutes. Stir for 5 additional minutes. Ensure temperature stays below 15° C. A tacky gooey mass should form. Decant supernatant. Add acetone (354 g) to the taffy, stir until a clear solution is obtained. Slowly add water/ice mix (460 g) to the reaction mixture, until the reaction mixture remains just cloudy. Stir for 2 minutes. This is the acetone dope.

Mix ice (460 g), water (460 g) and acetic acid (0.5 g), stir for 1 minute. Add 25% of the acetone dope to the acidified water/ice mixture. Stir for 20 minutes. Allow the contents to settle. Decant the supernatant. Repeat the process three further times for the remaining acetone dope. Combine all damp polymer fractions and wash in water (460 g). Repeat the water washing procedure. The yield is typically about 88% of the theoretical yield.

Example 37

This example illustrates preparation of a quadruple hydrogen bonding entity (QHBE)-containing mixture.

Synthesis of 6-Methyl-iso-cytosine

Dry ethanol (600 mL), 91.89 g of guanidine carbonate, and 146.1 g of ethyl acetoacetate were added to a 1 L flask. The reaction solution was gradually heated to reflux temperature and stirred overnight. Ethanol (300 mL) was evaporated, and the reaction mixture was heated under reflux for two hours. After the reaction mixture was cooled, 300 mL of hexane was added. The resulting precipitate was filtered, washed and dried. 119.3 g of 6-methyl-iso cytosine was obtained.

Preparation of a QHBE-containing Mixture

Into a 500 mL flask fitted with a silica gel drying tube were added 280.48 g of dried N,N-dimethyl acetamide and 43.76 g of dried 6-methyl-iso-cytosine. To this mixture was added 66.22 g of isophorone diisocyanate. The mixture was stirred at ambient temperature for five days. The resulting mixture was used without any further treatment to prepare QHB-modified polymers.

Example 38

This example illustrates the synthesis of a QHB-modified novolac resin.

Into a 500 mL flask fitted with a silica gel drying tube were added 50 g of a novolac resin and 125 g of dried N,N-dimethyl acetamide. To the resulting mixture were added 16.9 g of the QHBE reaction mixture prepared in Example 37 and 0.5 g of dibutyltin dilaurate. After 12 hr at 60° C., the reaction mixture was poured into water. The precipitated functionalized novolac resin was filtered off and dried at 40° C. with vacuum. Yield: 90%

Having described the invention, we now claim the following and their equivalents.

What is claimed is:

1. An imageable element comprising, in order:

a substrate having a hydrophilic surface, an underlayer comprising a first polymeric material over the hydrophilic surface of the substrate, and a top layer comprising a second polymeric material over the underlayer, in which:

the top layer is ink receptive and insoluble in an alkaline developer; and the top layer and the underlayer are each removable by the alkaline developer following thermal imaging of the element; and the second polymeric material is selected from the group consisting of:

solvent soluble novolac resins that have a weight average molecular weight of at least 18,000, derivatives thereof in which the novolac resin is functionalized with polar groups, derivatives thereof in which the novolac resin is functionalized with quadruple hydrogen bonding entities, and mixtures thereof.

2. The element of claim 1 in which the alkaline developer is a solvent based developer.

3. The element of claim 1 in which the second polymeric material is either a solvent soluble m-cresol only novolac resin or a solvent soluble m-cresol/p-cresol novolac resin that has up to 10 mol % of p-cresol in which the novolac resin has a weight average molecular weight of at least 25,000.

4. The element of claim 1 in which the second polymeric material is either a solvent soluble m-cresol only novolac resin or a solvent soluble m-cresol/p-cresol novolac resin that has up to 10 mol % of p-cresol and in which the novolac resin is functionalized with QHB entities.

5. The element of claim 4 in which the weight average molecular weight of the novolac resin is at least 25,000.

6. The element of claim 1 in which the second polymeric material is a solvent soluble m-cresol/p-cresol novolac resin that comprises at least 10 mol % p-cresol and in which the novolac resin is functionalized with QHB entities.

7. The element of claim 6 in which the weight average molecular weight of the novolac resin is at least 25,000.

8. The element of claim 1 in which the novolac resin is prepared by solvent condensation.

9. The element of claim 8 in which the weight average molecular weight of the novolac resin is at least 25,000.

10. The element of claim 1 in which the second polymeric material is a solvent soluble m-cresol/p-cresol novolac resin that comprises at least 10 mol % p-cresol.

11. The element of claim 10 in which the weight average molecular weight of the novolac resin is at least 25,000.

12. The element of claim 10 in which the m-cresol/p-cresol novolac resin comprises 30 mol % to 60 mol % p-cresol.

13. The element of claim 10 in which the m-cresol/p-cresol novolac resin comprises 30 mol % to 40 mol % p-cresol.

14. The element of claim 13 in which the weight average molecular weight of the novolac resin is at least 25,000.

15. The element of claim 1 in which the second polymeric material is either a solvent soluble m-cresol only novolac resin or a solvent soluble m-cresol/p-cresol novolac resin that has up to 10 mol % of p-cresol and in which the novolac resin is functionalized with polar groups.

16. The element of claim 15 in which the weight average molecular weight of the novolac resin is at least 25,000.

17. The element of claim 1 in which the novolac resin comprises from 10% to 50% p-cresol and in which the weight average molecular weight of the novolac resin is at least 20,000.

18. The element of claim 1 in which the second polymeric material is a solvent soluble m-cresol/p-cresol novolac resin that comprises at least 10 mol % p-cresol in which the novolac resin and in which the novolac resin is functionalized with polar groups.

19. The element of claim 18 in which the m-cresol/p-cresol novolac resin comprises 30 mol % to 60 mol % p-cresol.

20. The element of claim 18 in which the m-cresol/p-cresol novolac resin comprises 30 mol % to 40 mol % p-cresol.

21. The element of claim 20 in which the m-cresol/p-cresol novolac resin has a weight average molecular weight of at least 25,000.

22. The element of claim 1 in which the imageable element additionally comprises a photothermal conversion material.

23. The element of claim 22 in which the photothermal conversion material is in the underlayer or in an absorber layer between the underlayer and the top layer.

24. The element of claim 23 in which the weight average molecular weight of the novolac resin is at least 25,000.

25. The element of claim 25 in which the second polymeric material is either a solvent soluble m-cresol only novolac resin or a solvent soluble m-cresol/p-cresol novolac resin that has up to 10 mol % of p-cresol.

26. A method for forming an image, the method comprising the steps of:

(A) thermally imaging an imageable element and forming an imaged element comprising imaged and unimaged regions;

in which the imageable element comprises:

a substrate having a hydrophilic surface, an underlayer comprising a first polymeric material over the hydrophilic surface of the substrate, and a top layer comprising a second polymeric material over the underlayer, in which:

the top layer is ink receptive and insoluble in an alkaline developer; and the top layer and the underlayer are each removable by the alkaline developer following thermal imaging of the element; and the second polymeric material is selected from the group consisting of:

solvent soluble novolac resins that have a weight average molecular weight of at least 18,000, derivatives thereof in which the novolac resin is functionalized with polar groups, and derivatives thereof in which the novolac resin is functionalized with quadruple hydrogen bonding entities, and mixtures thereof; and (B) developing the imaged element in an alkaline developer and removing the imaged regions.

27. The method of claim 26 in which the developer is a solvent based developer.

28. The method of claim 26 in which imaging is carried out with a heated body.

29. The method of claim 26 in which the element additionally comprises a photothermal conversion material and imaging is carried out with an infrared laser.

30. The method of claim 29 in which the novolac resin has a weight average molecular weight of at least 25,000.

31. The method of claim 26 in which the second polymeric material is a novolac resin that has a weight average molecular weight of at least 25,000.

32. The method of claim 31 in which the developer is a solvent based developer.

33. The method of claim 32 in which the second polymeric material is a m-cresol/p-cresol novolac resin that comprises 30 mol % to 40 mol % p-cresol.

34. An image, formed by the steps of (A) thermally imaging an imageable element and forming an imaged element comprising imaged and unimaged regions;

in which the imageable element comprises:

a substrate having a hydrophilic surface, an underlayer comprising a first polymeric material over the hydrophilic surface of the substrate, and a top layer comprising a second polymeric material over the underlayer, in which:

the top layer is ink receptive and insoluble in an alkaline developer; and the top layer and the underlayer are each removable by the alkaline developer following thermal imaging of the element; and the second polymeric material is selected from the group consisting of:

solvent soluble novolac resins that have a weight average molecular weight of at least 18,000, derivatives thereof functionalized in which the novolac resin is with polar groups, and derivatives thereof in which the novolac resin is functionalized with quadruple hydrogen bonding entities, and mixtures thereof; and (B) forming the image by developing the imaged element in an alkaline developer and removing the imaged regions.

35. The image of claim 34 in which the second polymeric material is, novolac resin that has a weight average molecular weight of at least 25,000.

36. The image of claim 35 in which the developer is a solvent based developer.

37. The image of claim 36 in which the second polymeric material is a m-cresol/p-cresol novolac resin that comprises 30 mol % to 40 mol % p-cresol.

* * * * *

UNITED STATES PATENT AND TRADEMARK OFFICE

CERTIFICATE OF CORRECTION

PATENT NO. : 6,858,359 B2
DATED : February 22, 2005
INVENTOR(S) : Anthony P. Kitson, Kevin B. Ray and Eugene L. Sheriff It is certified that error appears in the above-identified patent and that said Letters Patent is hereby corrected as shown below:

Column 24,
Line 65, delete "p-cresol in which" and insert -- p-cresol and in which --

Column 25,
Line 64, delete "claim 25" and insert -- claim 24 --

Signed and Sealed this

Twenty-fourth Day of May, 2005

JON W. DUDAS
*Director of the United States Patent and Trademark Office*